United States Patent
Ito et al.

(10) Patent No.: US 7,679,153 B2
(45) Date of Patent: Mar. 16, 2010

(54) SEALED SURFACE ACOUSTIC WAVE ELEMENT PACKAGE

(75) Inventors: Haruki Ito, Chino (JP); Nobuaki Hashimoto, Suwa (JP)

(73) Assignee: Seiko Epson Corporation (JP)

( * ) Notice: Subject to any disclaimer, the term of this patent is extended or adjusted under 35 U.S.C. 154(b) by 1080 days.

(21) Appl. No.: 11/204,217

(22) Filed: Aug. 15, 2005

(65) Prior Publication Data

US 2006/0055013 A1    Mar. 16, 2006

(30) Foreign Application Priority Data

Sep. 13, 2004  (JP) ............... 2004-265189
Apr. 21, 2005  (JP) ............... 2005-123476

(51) Int. Cl.
*H01L 23/31* (2006.01)
(52) U.S. Cl. ............ 257/416; 257/774; 257/783; 257/678; 257/E23.07; 257/E23.151; 257/E23.168
(58) Field of Classification Search ........... 257/771, 257/774, 783, 678, E23.07, E23.141, E23.151, 257/E23.168, E23.169, E23.174, 416
See application file for complete search history.

(56) References Cited

U.S. PATENT DOCUMENTS

| | | | |
|---|---|---|---|
| 5,448,014 A | 9/1995 | Kong et al. | |
| 6,229,404 B1 | 5/2001 | Hatanaka | |
| 6,310,422 B1 | 10/2001 | Satoh et al. | |
| 6,511,894 B2 * | 1/2003 | Song ............ | 438/455 |
| 6,667,664 B2 | 12/2003 | Akagawa et al. | |
| 6,831,000 B2 | 12/2004 | Murayama | |
| 7,266,869 B2 * | 9/2007 | Hatanaka et al. ........ | 29/25.35 |
| 7,324,350 B2 * | 1/2008 | Heck et al. ........... | 361/760 |
| 2001/0033120 A1 | 10/2001 | Kobayashi et al. | |
| 2002/0121337 A1 | 9/2002 | Whatmore et al. | |
| 2004/0029356 A1 | 2/2004 | Timme et al. | |
| 2005/0218488 A1 * | 10/2005 | Matsuo ............... | 257/678 |

FOREIGN PATENT DOCUMENTS

| | | |
|---|---|---|
| CN | 1103203 | 5/1995 |
| EP | 1 143 614 | 10/2001 |
| EP | 1 198 003 A1 | 4/2002 |
| EP | 1 313 217 | 5/2003 |
| JP | 11-103228 | 4/1999 |
| JP | 2002-152000 | 5/2002 |
| JP | 2002-290184 | 10/2002 |

(Continued)

OTHER PUBLICATIONS

Communication from European Patent Office re: related application.

*Primary Examiner*—Julio J Maldonado
(74) *Attorney, Agent, or Firm*—Harness, Dickey & Pierce, P.L.C.

(57) ABSTRACT

An electronic component includes: a semiconductor substrate having a first surface and a second surface opposing to the first surface; a trans-substrate conductive plug that penetrates the semiconductor substrate from the first surface to the second surface; an electronic element provided in the vicinity of the first surface of the semiconductor; and a sealing member that seals the electronic element between the sealing member and the first surface, wherein the electronic element is electrically connected to the trans-substrate conductive plug.

5 Claims, 9 Drawing Sheets

FOREIGN PATENT DOCUMENTS

| | | |
|---|---|---|
| JP | 2002-290200 | 10/2002 |
| JP | 2002-290202 | 10/2002 |
| JP | 2003-273106 | 9/2003 |
| JP | 2004-503164 | 1/2004 |
| JP | 2004-214787 | 7/2004 |
| JP | 2004-221357 | 8/2004 |
| JP | 2004-523949 | 8/2004 |
| WO | WO 01/58007 | 8/2001 |
| WO | WO 01/71805 | 9/2001 |

* cited by examiner

SEALED SURFACE ACOUSTIC WAVE ELEMENT PACKAGE

BACKGROUND OF THE INVENTION

1. Field of the Invention

The present invention relates to an electronic component, to a circuit board, to an electronic apparatus, and to a method for manufacturing an electronic component.

Priority is claimed on Japanese Patent Application No. 2004-265189, filed Sep. 13, 2004, and Japanese Patent Application No. 2005-123476, filed Apr. 21, 2005, the contents of which are incorporated herein by reference.

2. Description of Related Art

In recent years, an electronic component having a surface acoustic wave element (hereinafter, referred to as an "SAW element") as a resonator or a band-pass filter or the like, has been used in electronic apparatuses, such as cellular phones or television receivers. Japanese Unexamined Patent Application, First Publications Nos. 2002-290184 and 2002-290200 disclose examples of the technique relating to an electronic component having an SAW element. Japanese Unexamined Patent Application, First Publication No. 2002-290184 discloses a technique relating to packaging of electronic components in which an SAW element and an integrated circuit that drives the SAW element are packaged into the same package. Another technique relating to packaging is disclosed in Japanese Unexamined Patent Application, First Publication No. 2002-290200, in which an SAW element is mounted on a first substrate and an integrated circuit is mounted on a second substrate.

Because of an increasing demand for reduction in the size of an electronic apparatus in which an electronic component having an SAW element is used, reduction in the size of electronic components also has been required. However, the technique disclosed in the above-described Japanese Unexamined Patent Application, First Publication No. 2002-290184 could not meet this demand for size reduction since an SAW element and an integrated circuit are arranged side by side. Likewise, the structure disclosed in Japanese Unexamined Patent Application, First Publication No. 2002-290200 have a difficulty in achieving reduction in the thickness (and/or size) since a first substrate on which an SAW element is mounted and a second substrate having an integrated circuit formed thereon are stacked together.

In addition to electronic components having SAW elements, size reduction of electronic components having other electronic elements, such as a crystal resonator, a piezoelectric vibrator, and a piezoelectric tuning fork, is also demanded.

SUMMARY OF THE INVENTION

The present invention was conceived against the above-described background, and an object thereof is to provide an electronic component, a circuit-board, an electronic apparatus, and a method for manufacturing an electronic component that can accomplish size reduction.

In order to achieve the above-described shortcomings, an electronic component of the present invention includes: a semiconductor substrate having a first surface and a second surface opposing to the first surface; a trans-substrate conductive plug that penetrates the semiconductor substrate from the first surface to the second surface; an electronic element provided in the vicinity of the first surface of the semiconductor; and a sealing member that seals the electronic element between the sealing member and the first surface, wherein the electronic element is electrically connected to the trans-substrate conductive plug.

According to the present invention, the electronic element is provided in the vicinity of the first surface of the semiconductor substrate, and the electronic element is connected to the trans-substrate conductive plug that penetrates the semiconductor substrate from the first surface to the second surface. Thus, it is possible to electrically connect between the electronic element and an integrated circuit that drives and controls the electronic element via trans-substrate conductive plug by providing the integrated circuit on the second surface of the semiconductor substrate. Accordingly, it is possible to achieve superior operating performance of the electronic element while realizing reduction in the size and thickness of the electronic component. In addition, since the electronic element is sealed by the sealing member between the sealing member and the first surface, it is possible to reliably seal the electronic element while realizing reduction in size and thickness, in addition to achieving superior operating performance of the electronic element. Thus, according to the present invention, an electronic component that functions as a semiconductor package, an electronic element, and a seal, and has the size of a semiconductor substrate (real chip size: an ultimately small size) can be provided.

In the electronic component according to the present invention, the electronic element may be provided on the first surface of the semiconductor substrate.

According to the present invention, formation of the electronic element on the first surface of the semiconductor substrate can realize further reduction in size and thickness of the electronic component.

In the electronic component according to the present invention, the electronic element may be provided spaced apart from the first surface.

According to the present invention, provision of the electronic element spaced apart from the first surface of the semiconductor substrate can enhance the flexibility of the design of the electronic element. By connecting between the electronic element and the trans-substrate conductive plug while providing the electronic element spaced apart from the first surface, it is possible to achieve superior operating performance of the electronic element while realizing reduction in the size and thickness of the electronic component.

In the electronic component according to the present invention, the electronic component may further include a second member having a third surface that faces the first surface, and the electronic element that is connected to the trans-substrate conductive plug may be provided on the third surface.

According to the present invention, since the electronic element is provided on the third surface of the second member, it is possible to firmly support the electronic element on the second member. Thus, superior operating performance of the electronic element can be achieved.

In the electronic component according to the present invention, the second member may include the sealing member.

According to the present invention, provision of the electronic element on the sealing member can enhance the flexibility of the design of the electronic element while achieving the reduction in the number of parts. By connecting between the electronic element and the trans-substrate conductive plug while supporting the electronic element on the sealing element, it is possible to achieve superior operating performance of the electronic element while realizing reduction in the size and thickness of the electronic component.

In the electronic component according to the present invention, the second member may include a second substrate provided between the first surface and the sealing member.

According to the present invention, provision of the electronic element on the second substrate provided between the first surface and the sealing member can enhance the flexibility of the design of the electronic element. By connecting between the electronic element and the trans-substrate conductive plug while supporting the electronic element on the second substrate, it is possible to achieve superior operating performance of the electronic element while realizing reduction in the size and thickness of the electronic component.

In the electronic component according to the present invention, a connecting terminal for connecting to an external apparatus may be provided above the second surface of the semiconductor substrate.

According to the present invention, it is possible to electrically connect the electronic component to an external apparatus (e.g., a circuit board) via the connecting terminal provided on the second surface of the semiconductor substrate. Thus, the electronic component having a reduced size and thickness can be mounted on the external apparatus, thereby preventing an increase in the size of the external apparatus as a whole.

In the electronic component according to the present invention, the electronic element may include a surface acoustic wave element.

According to the present invention, it is possible to achieve superior operating performance of the surface acoustic wave element while realizing reduction in the size and thickness of the electronic component. In addition, since the surface acoustic wave element is sealed by the sealing member between the sealing member and the first surface, it is possible to reliably seal the surface acoustic wave element while realizing reduction in size and thickness, in addition to achieving superior operating performance of the surface acoustic wave element. It should be noted that the electronic element according to the present invention is not limited to the surface acoustic wave element, and may be any element that are required to be sealed, for example, a crystal resonator, a piezoelectric vibrator, a piezoelectric tuning fork, or the like.

A circuit board according to the present invention includes the electronic component described above.

According to the present invention, it is possible to provide a circuit board (e.g., a printed wire board, or the like) in which the electronic component having a reduced size and thickness is used. Thus, it is possible to prevent an increase in the size of an electronic apparatus in which the circuit board is used.

An electronic apparatus according to the present invention includes the electronic component described above.

According to the present invention, it is possible to provide an electronic apparatus in which the electronic component with a reduced size and thickness is used. Thus, a relatively small-sized electronic apparatus can be provided.

A method for manufacturing an electronic component according to the present invention includes: providing a trans-substrate conductive plug that penetrates a semiconductor substrate from a first surface of the semiconductor substrate to a second surface of the semiconductor substrate opposing to the first surface; providing an electronic element in the vicinity of the first surface of the semiconductor substrate, the electronic element being electrically connected to the trans-substrate conductive plug; and connecting, to the electronic element, a sealing member that seals the electronic element between the sealing member and the first surface.

According to the present invention, the electronic element is provided in the vicinity of the first surface of the semiconductor substrate, and the electronic element is connected to the trans-substrate conductive plug that penetrates the semiconductor substrate from the first surface to the second surface. Thus, it is possible to electrically connect between the electronic element and an integrated circuit that drives and controls the electronic element via trans-substrate conductive plug by providing the integrated circuit on the second surface of the semiconductor substrate. Accordingly, it is possible to achieve superior operating performance of the electronic element while realizing reduction in the size and thickness of the electronic component. In addition, since the electronic element is sealed by the sealing member between the sealing member and the first surface, it is possible to reliably seal the electronic element while realizing reduction in size and thickness, achieving superior operating performance of the electronic element.

In the manufacturing method according to the present invention, the method may further include defining a hole in the second surface of the semiconductor substrate; disposing a conductive material to form the trans-substrate conductive plug inside the hole; and after the disposition of conductive material, subjecting the first surface of the semiconductor substrate to a treatment for reducing a thickness of the semiconductor substrate.

According to the present invention, by defining the hole in the second surface of the semiconductor substrate, disposing the conductive material inside the hole, and then providing the first surface with a predetermined treatment to reduce the thickness of the semiconductor substrate, it is possible to expose the trans-substrate conductive plug to the first surface side. Thus, the trans-substrate conductive plug can be formed efficiently.

In the manufacturing method according to the present invention, the method may further include forming a plurality of electronic elements on a single semiconductor substrate substantially at the same time; and dicing the semiconductor substrate into the respective electronic elements.

According to the present invention, by forming a plurality of electronic elements on a single semiconductor substrate substantially at the same time and then dicing the semiconductor substrate into the respective electronic elements, the electronic component can be manufactured efficiently. Thus, it is possible to reduce the manufacturing cost of electronic components.

In the manufacturing method according to the present invention, the electronic element may include a surface acoustic wave element.

According to the present invention, it is possible to achieve superior operating performance of the surface acoustic wave element while realizing reduction in the size and thickness of the electronic component. In addition, since the surface acoustic wave element is sealed by the sealing member between the sealing member and the first surface, it is possible to reliably seal the surface acoustic wave element while realizing reduction in size and thickness, in addition to achieving superior operating performance of the surface acoustic wave element. It should be noted that the electronic element according to the present invention is not limited to the surface acoustic wave element, and may be any element that are required to be sealed, for example, a crystal resonator, a piezoelectric vibrator, a piezoelectric tuning fork, or the like.

DETAILED DESCRIPTION OF THE INVENTION

Hereafter, various embodiments of the present invention will be described with reference to the drawings.

Surface Acoustic Wave Apparatus

First Embodiment

An electronic component according to a first embodiment of the present invention will be explained with reference to FIG. 1. By way of illustration, this embodiment will be explained using an example in which an electronic element of the present invention is a surface acoustic wave element and an electronic component is a surface acoustic wave apparatus. In the following description, a surface acoustic wave element is referred to as an "SAW element", and a surface acoustic wave apparatus is referred to as an "SAW package."

Figure 1:
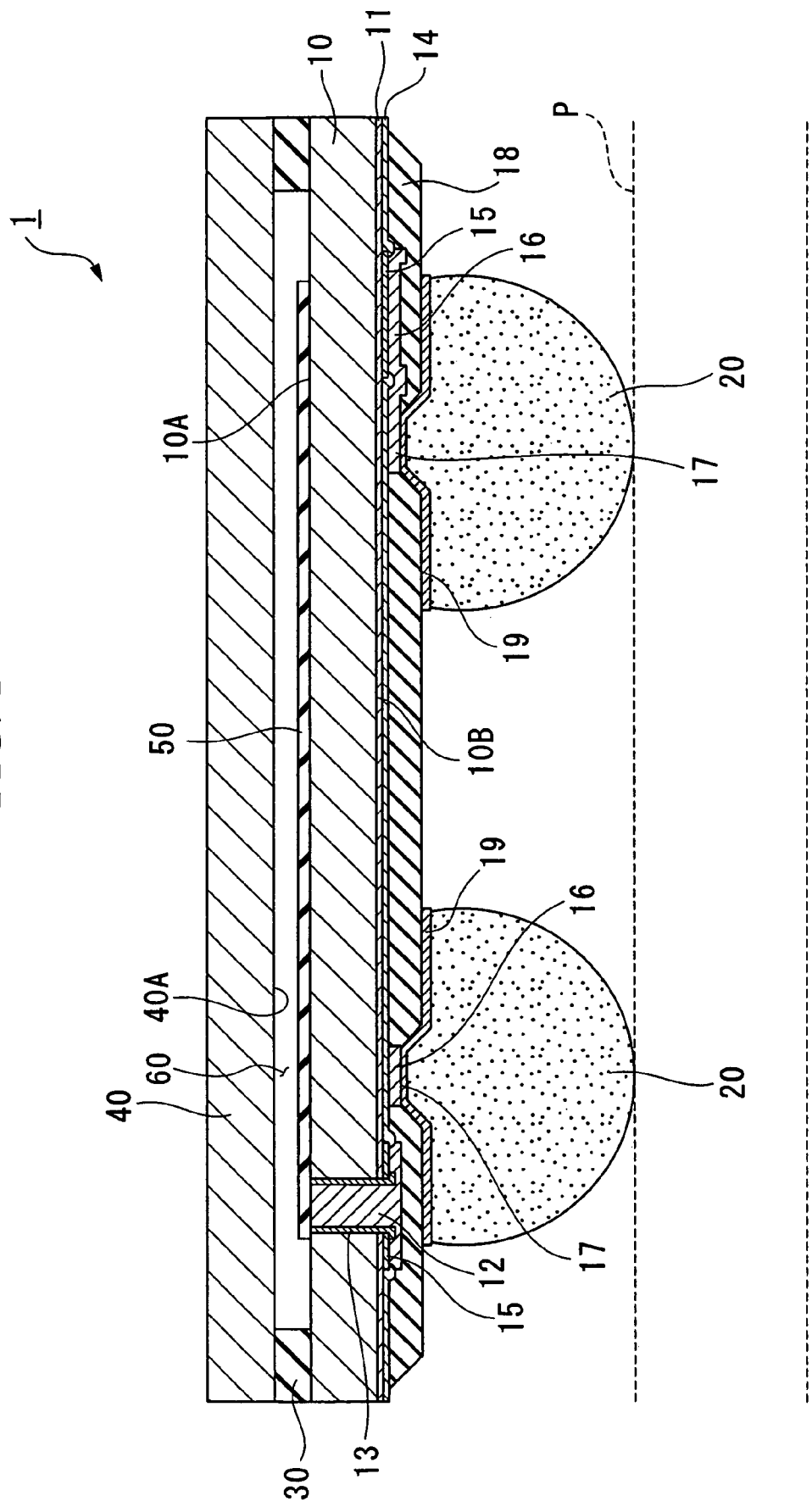
FIG. 1 is a cross-sectional view of an electronic component according to a first embodiment of the present invention.

In FIG. 1, an SAW package 1 includes a semiconductor substrate 10 made of a silicon substrate, an SAW element 50 that is provided in the vicinity of a first surface 10A of the semiconductor substrate 10, and a trans-substrate conductive plug 12 that penetrates through the semiconductor substrate 10 from the first surface 10A to a second surface 10B that is the surface opposing to the first surface 10A. The SAW element 50 is provided on the first surface 10A of the semiconductor substrate 10. The SAW element 50 is configured to have a piezoelectric thin film and comb-shaped electrodes that come contact with the piezoelectric thin film, and is formed on the first surface 10A of the semiconductor substrate 10. Although not shown in FIG. 1, an integrated circuit having transistors, memory elements, or other electronic elements is formed on the second surface 10B of the semiconductor substrate 10. A first end of the trans-substrate conductive plug 12 is electrically connected to the SAW element 50 provided on the first surface 10A, and a second end of the trans-substrate conductive plug 12 is electrically connected to the integrated circuit provided on the second surface 10B via electrodes 15. As a result, the SAW element 50 provided on the first surface 10A of the semiconductor substrate 10 and the integrated circuit provided on the second surface 10B of the semiconductor substrate 10 are electrically connected each other via the trans-substrate conductive plug 12. In addition, an insulating film 13 is provided between the trans-substrate conductive plug 12 and the semiconductor substrate 10, and electrically isolates the trans-substrate conductive plug 12 from the semiconductor substrate 10.

Furthermore, the SAW package 1 includes a sealing member 40 for sealing the SAW element 50 between the sealing member 40 and the first surface 10A. The sealing member 40 is made from a glass substrate. It should be noted that the sealing member 40 may be a silicon substrate. A third surface 40A of the sealing member 40 which faces the first surface 10A of the semiconductor substrate 10 is positioned spaced apart from the first surface 10A. The periphery of the third surface 40A of the sealing member 40 is bonded to the periphery of the first surface 10A of the semiconductor substrate 10 by means of an adhesive layer. The adhesive layer 30 is made of, for example, a synthetic resin, such as a polyimide resin or the like. The inner space 60 defined by the first surface 10A of the semiconductor substrate 10, the third surface 40A of the sealing member 40, and the adhesive layer 30 are substantially sealed (airtight sealing), and the SAW element 50 is enclosed within this inner space 60.

On the second surface 10B of the semiconductor substrate 10, an underlying layer 11 is provided. The underlying layer 11 is made of, for example, an insulating material such as silicon dioxide ($SiO_2$) or the like. Furthermore, the electrodes 15 are provided in each of a plurality of predetermined locations of the underlying layer, and a first insulating layer 14 is provided in the area other than the locations in which the electrodes 15 are formed. Furthermore, a plurality of first wires 16 are provided on the first insulating layer 14, and certain first wires 16 of the plurality of first wires 16 are electrically connected to some of the plurality of electrodes 15. Furthermore, certain electrodes 15 of the plurality of electrodes 15 are electrically connected to the second end of the trans-substrate conductive plug 12. Furthermore, on the first insulating layer 14, a second insulating layer 18 is provided so as to cover the trans-substrate conductive plug 12 and portions of the first wires 16. Furthermore, portions of the first wires 16 are exposed from the second insulating layer 18 to define lands 17. Second wires 19 are provided on the lands 17, and these lands 17 (the first wires 16) are electrically connected to the second wires 19. On the second wires 19, bumps 20, which function as terminals for establishing an electrical connection with an external apparatus, are provided. The bumps 20 are provided above the second surface 10B of the semiconductor substrate 10, and the SAW package 1 electrically connects to a printed wire board P, i.e., an external apparatus via the bumps 20.

Method for Manufacturing Surface Acoustic Wave Apparatus

Figure 12:
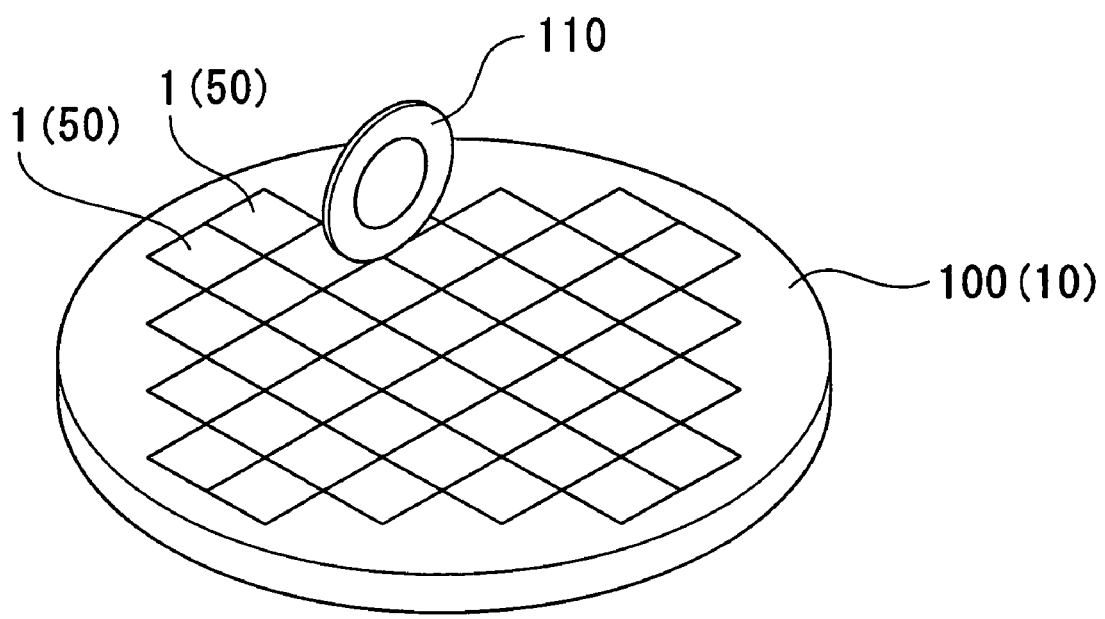
FIG. 12 is a diagram illustrating the manufacturing process of an electronic component.

Next, a method for manufacturing a SAW package will be explained with reference to FIGS. 2 to 12. It should be noted that although numerous SAW packages 1 are formed at the same time on a single silicon substrate 100 (see. FIG. 12) in this embodiment, a manufacturing process of a single SAW package 1 is illustrated in FIGS. 2 to 11 for simplicity of illustration.

Figure 2:
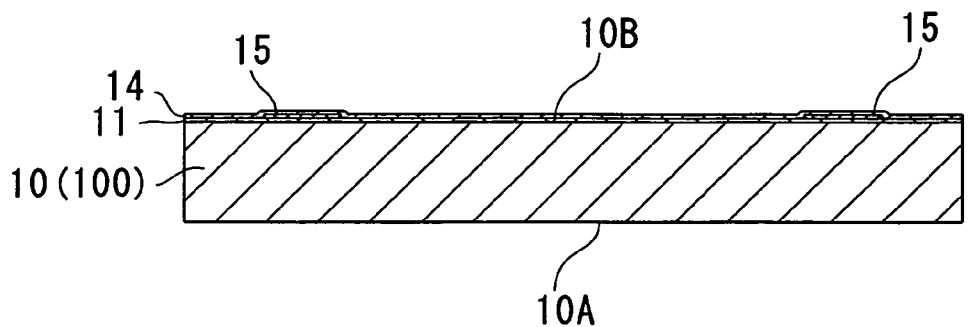
FIG. 2 is a diagram illustrating a manufacturing process of an electronic component.

First, as shown in FIG. 2, the underlying layer 11 is formed on the second surface 10B of the semiconductor substrate 10, and then the electrodes 15 are formed on this underlying layer 11. In this embodiment, although not shown in FIG. 2, an integrated circuit having transistors, memory elements, or other electronic elements has been formed on the second surface 10B of the semiconductor substrate 10. The underlying layer 11 is an insulating layer, and is made of an oxide film (SiO$_2$) of silicon (Si). The electrodes 15 are electrically connected to the integrated circuit, and are made of titanium (Ti), titanium nitride (TiN), aluminum (Al), copper (Cu), or the like. Then, the first insulating layer 14 is provided so as to cover the underlying layer 11 and the electrodes 15.

The first insulating layer 14 may be formed using a polyimide resin, a silicone-modified polyimide resin, an epoxy resin, a silicone-modified epoxy resin, an acrylic resin, a phenol resin, benzocyclobutene (BCB), polybenzooxazole (PBO), or the like. Alternatively, the first insulating layer 14 may be formed using any other materials, such as silicon dioxide (SiO$_2$), silicon nitride (SiN), or the like, as long as the material exhibits the insulation property.

Figure 3:
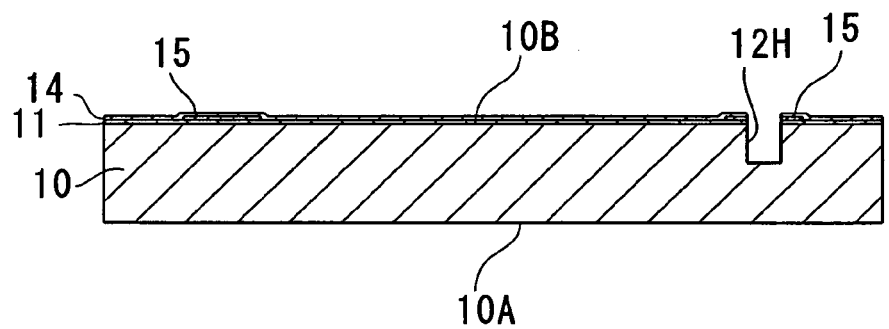
FIG. 3 is a diagram illustrating the manufacturing process of an electronic component.
Figure 4:
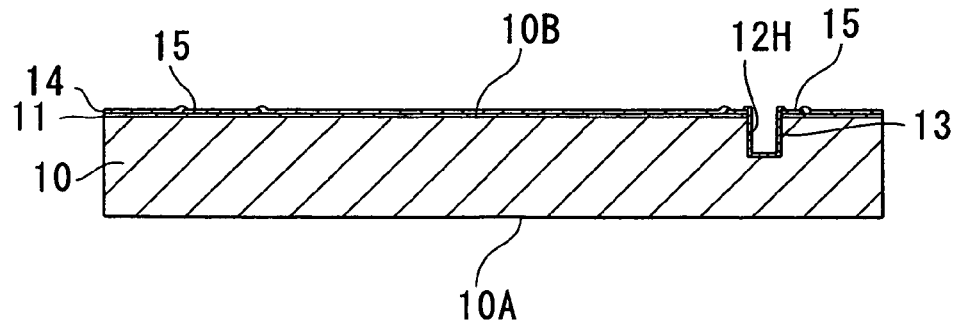
FIG. 4 is a diagram illustrating the manufacturing process of an electronic component.

Next, a photoresist (not shown) is coated on the entire surface of the first insulating layer 14 using the spin-coating method or the like. The semiconductor substrate 10 is then subjected to an exposure process using a mask having a predetermined pattern formed thereon, and a development process is carried out afterward. In the above processes, the photoresist is patterned to a predetermined pattern. An etching process is carried out in which a portion of the first insulating layer 14 covering the electrode 15 located on the right side is removed to define an opening. Next, using the photoresist on the first insulating layer 14 having the opening defined therein as a mask, a portion of the electrode 15 located on the right side of the plurality of electrodes 15 is removed with a dry etching process to define an opening. Furthermore, the portion of the underlying layer 11 and the portion of the semiconductor substrate 10 corresponding to the opening are removed in the etching process. In the above-described processes, a hole 12H is defined in the second surface 10B side of the semiconductor substrate 10 as shown in FIG. 3.

Next, the insulating film 13 is formed on the first insulating layer 14 and the inner wall and the bottom of the hole 12H. The insulating film 13 is provided for the purpose of preventing leak current, and corrosion of the semiconductor substrate 10 caused by oxygen, water, or the like, for example. The material of the insulating film 13 may be tetra ethyl ortho silicate, i.e., Si(OC$_2$H$_5$)$_4$, (hereinafter referred to as "TEOS") deposited using the plasma-enhanced chemical vapor deposition (PECVD) technique, i.e., PE-TEOS; or a TEOS formed using the ozone chemical vapor deposition (CVD), i.e., O$_3$-TEOS; or silicon dioxide (SiO$_2$) formed using a CVD method. It should be noted that the insulating film 13 may be formed using any other materials, such as a resin, as long as the material exhibits the insulation property. For simplicity of illustration, the insulating film 13 provided on the first insulating layer 14 is not shown in the drawings. The insulating film 13 and the first insulating layer 14 provided on the electrodes 15 are then removed with an etching technique to obtain the structure shown in FIG. 4.

Figure 5:
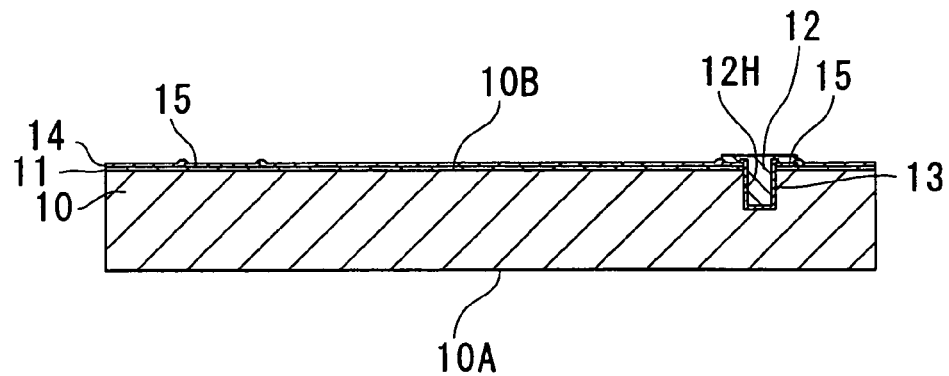
FIG. 5 is a diagram illustrating the manufacturing process of an electronic component.

Next, the inside of the hole 12H and the surface of the electrodes 15 are plated with the electro-chemical plating (ECP) technique to provide a conductive material inside the hole 12H for a subsequent formation of the trans-substrate conductive plug 12 inside the hole 12H. A conductive material that can used for forming the trans-substrate conductive plug 12 may be copper (Cu), for example, and copper is filled in the hole 12H. In this process, the trans-substrate conductive plug 12 protruding above the electrodes 15 is formed, and the structure shown in FIG. 5 is obtained. The process of forming the trans-substrate conductive plug 12 in this embodiment includes a step of forming (depositing) TiN and/or Cu by a sputtering method and a step of plating Cu. Alternatively, the process may include a step of forming (depositing) TiW and/or Cu by a sputtering method and a step of plating Cu. It should be noted that the method for forming the trans-substrate conductive plug 12 is not limited to the particular methods descried above, and the trans-substrate conductive plug 12 may be formed by filling a conductive paste, molten metal, or a metal wire, or the like in the hole.

Figure 6:
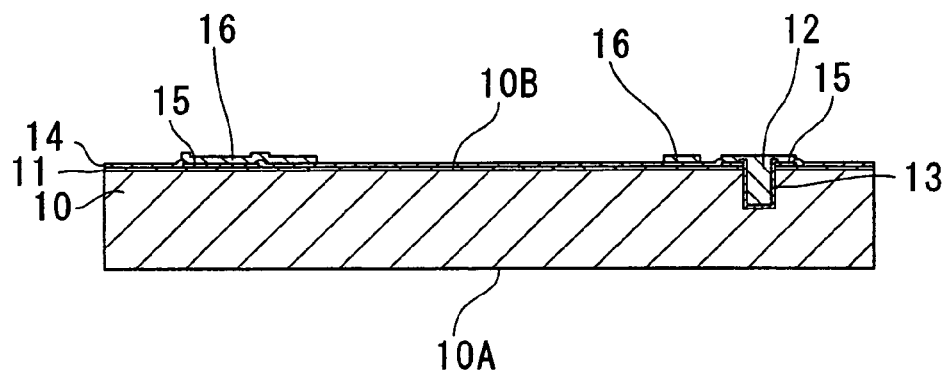
FIG. 6 is a diagram illustrating the manufacturing process of an electronic component.

Next, as shown in FIG. 6, a plurality of first wires 16 are formed on the first insulating layer 14. Some of the first wires 16 of the plurality of first wires 16 are provided such that they are electrically connected to the electrodes 15 located on the left side in FIG. 6. The first wires 16 is formed using a material containing at least one member selected from the group consisting of copper (Cu), chromium (Cr), titanium (Ti), nickel (Ni), titanium tungsten (TiW), gold (Au), silver (Ag), aluminum (Al), nickel vanadium (NiV), tungsten (W), titanium nitride (TiN), and lead (Pb). Furthermore, the first wires may be formed by stacking layers of films made of at least two of the materials described above. In this embodiment, the process of forming the first wires 16 includes a step of stacking films of TiW, Cu, or TiW, in order, by a sputtering method. Alternatively, the process may include a step of forming (depositing) TiW and Cu in order by a sputtering method and a step of plating Cu.

Figure 7:
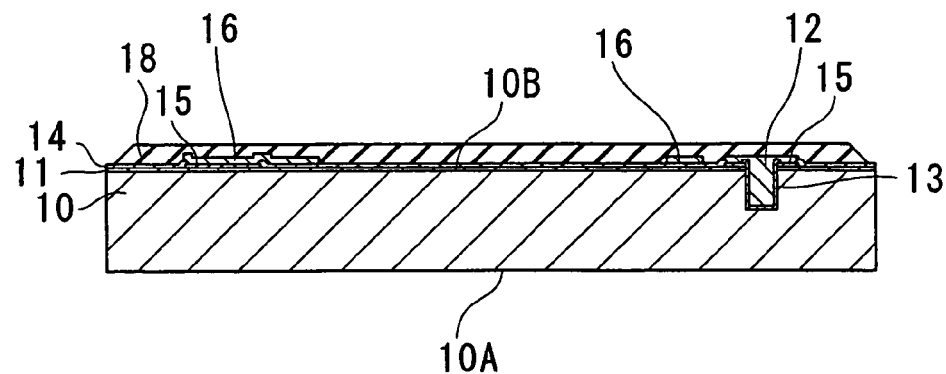
FIG. 7 is a diagram illustrating the manufacturing process of an electronic component.

Next, as shown in FIG. 7, the second insulating layer 18 is provided so as to cover the trans-substrate conductive plug 12, the first wires 16, and the first insulating layer 14. The second insulating layer 18 may be formed using a polyimide resin, a silicone-modified polyimide resin, an epoxy resin, a silicone-modified epoxy resin, an acrylic resin, a phenol resin, benzocyclobutene (BCB), polybenzooxazole (PBO), or the like. Alternatively, the second insulating layer 18 may be formed using silicon dioxide (SiO$_2$), silicon nitride (SiN), or the like. It should be noted that the second insulating layer 18 may be formed using any other materials, as long as the material exhibits the insulation property.

Figure 8:
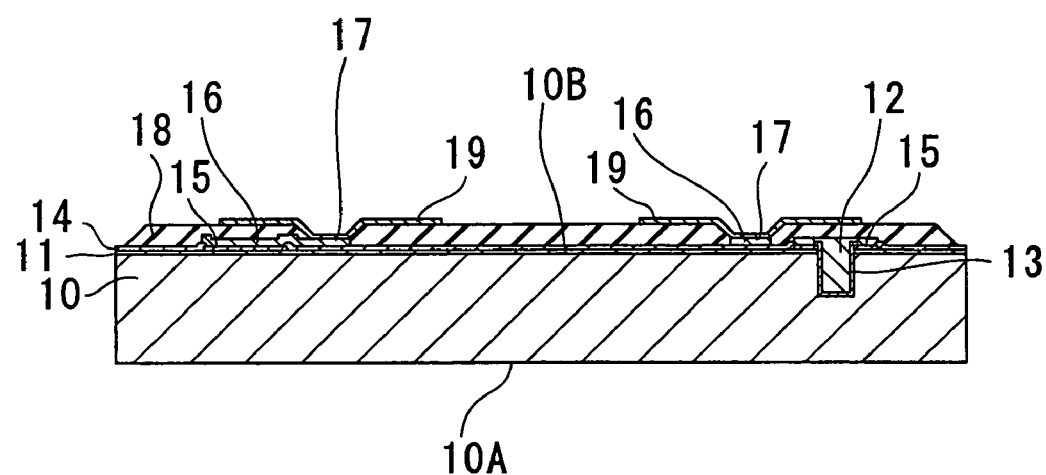
FIG. 8 is a diagram illustrating the manufacturing process of an electronic component.

Next, portions of the second insulating layer 18 in areas corresponding to the lands 17 are removed so that the portions of the first wires 16 are exposed and the lands 17 are defined. It should be noted that a photolithographic method including exposure and development processes may be used for removing the portions of the second insulating layer 18 corresponding to the lands 17. The second wires 19 are formed on the second insulating layer 18 so as to connect to the lands 17, and the structure shown in FIG. 8 is obtained.

Figure 9:
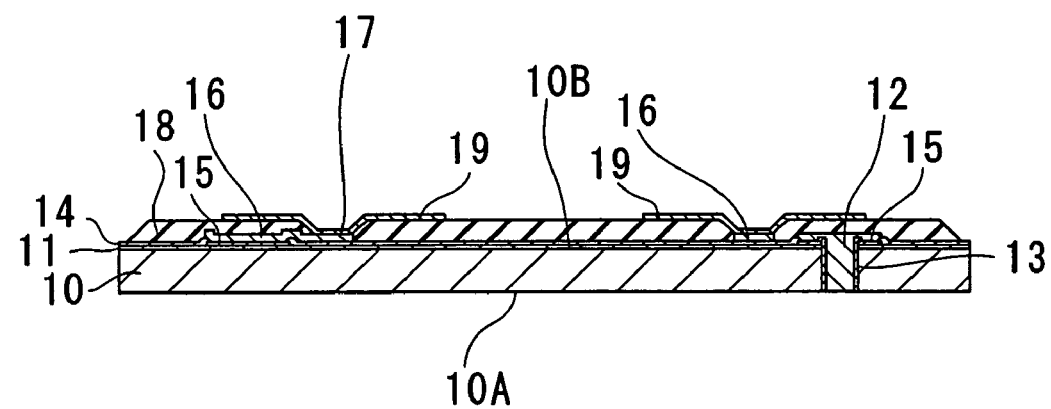
FIG. 9 is a diagram illustrating the manufacturing process of an electronic component.

Next, a glass plate (not shown) is bonded to the second surface 10B side of the semiconductor substrate 10 using an adhesive that is peelable by means of ultraviolet light (UV light) radiation. This glass plate constitutes a part of a wafer support system (WSS), in which the semiconductor substrate 10 is supported by this glass plate. The first surface 10A of the semiconductor substrate 10 having the glass plate attached thereon is subjected to a certain process, such as a dry etching process, a wet etching process, or the like. In this process, as shown in FIG. 9, the thickness of the semiconductor substrate 10 is reduced and the first end of the trans-substrate conductive plug 12 is exposed from the first surface 10A.

Figure 10:
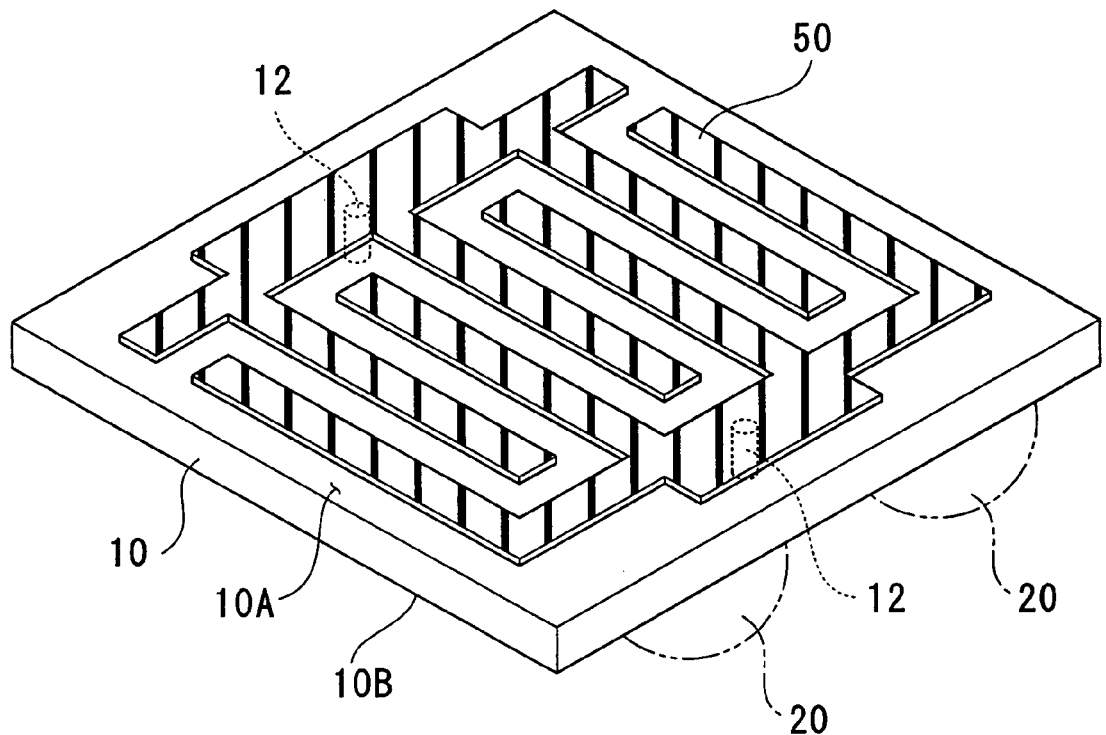
FIG. 10 is a diagram illustrating the manufacturing process of an electronic component.
Figure 11:
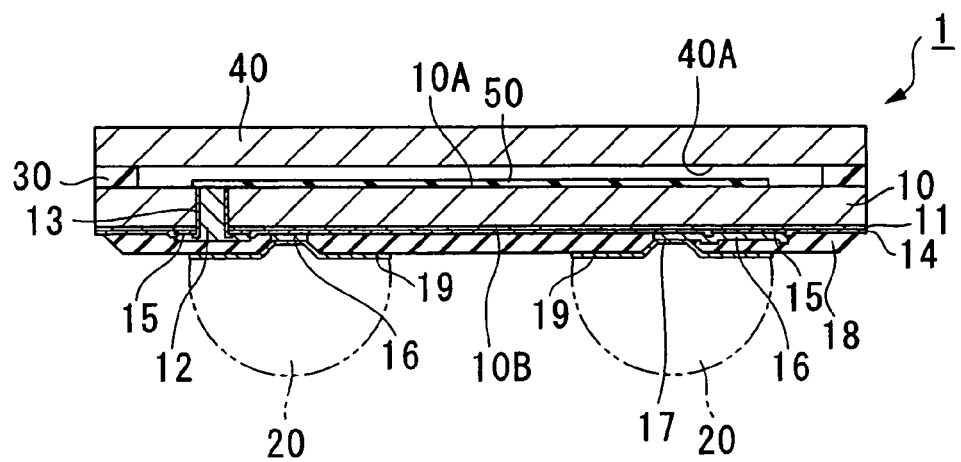
FIG. 11 is a diagram illustrating the manufacturing process of an electronic component.

Next, as shown in FIG. 10, the SAW element 50 is formed on the first surface 10A side of the semiconductor substrate 10. The process of forming the SAW element 50 includes a step of forming a piezoelectric thin film, a step of forming comb-shaped electrodes that come in contact with the piezoelectric thin film, and a step of forming a protective film. Furthermore, the step of forming the SAW element 50 includes a step of adjusting frequency by treating the SAW element 50 with plasma or the like. Materials that can be used for forming the piezoelectric thin film includes zinc oxide (ZnO), aluminum nitride (AlN), lithium niobate ($LiNbO_3$), lithium tantalate ($LiTaO_3$), potassium niobate ($KNbO_3$), or the like. Materials for forming the comb-shaped electrodes include metal containing aluminum. Materials for forming the protective film include silicon dioxide ($SiO_2$), silicon nitride ($Si_3N_4$), titanium nitride (TiN), or the like. The formed SAW element 50 is electrically connected to the first end of the trans-substrate conductive plug 12 that is exposed to the first surface 10A side.

Next, an adhesive for forming the adhesive layer 30 is disposed at least one of the first surface 10A of the semiconductor substrate 10 and the third surface 40A of the sealing member 40. The adhesive layer 30 may be a photosensitive polyimide adhesive or the like, for example. The semiconductor substrate 10 and the sealing member 40 are bonded together via the adhesive layer 30 such that the first surface 10A of the semiconductor substrate 10 and the third surface 40A of the sealing member 40 face each other. This provides the structure shown in FIG. 11. In this embodiment, the sealing may be vacuum seal in which the air in the inner space 60 is evacuated, or gas exchange sealing in which the air in the inner space 60 is replaced by certain gas, such as $N_2$, Ar, He, or the like. It should be noted that upon bonding the semiconductor substrate 10 and the sealing member 40 together, a metal protrusion may be provided along the periphery of the first surface 10A of the semiconductor substrate 10 and a metal layer that connects to the metal protrusion is provided to the third surface 40A of the sealing member 40, so that the semiconductor substrate 10 and the sealing member 40 are bonded together via the metal protrusion and the metal layer. When a glass is used as the sealing member 40, frequency adjustment of the SAW by means of laser or the like is required once the sealing is completed. Once the glass plate constituting the WSS is peeled off from the semiconductor substrate 10, the bumps 20 that are made of lead-free solder, for example, are formed on the second wires 19 provided on the second surface 10B side of the semiconductor substrate 10. It should be noted that the bumps 20 may be formed by disposing solder balls on the second wires 19, or by printing a solder paste on the second wires 19.

As described above, in the manufacturing steps that have been explained with reference to FIGS. 2 to 11, plural SAW elements 50, the electrodes 15 corresponding to the SAW elements 50, and the sealing members 40 are formed substantially at the same time above a single silicon substrate 100, in which plural SAW packages 1 are formed on a the silicon substrate 100. After the manufacturing step in shown FIG. 11, the silicon substrate 100 is diced into individual SAW elements 50 (individual SAW package 1) by a dicing machine 110, as shown in FIG. 12. This enables low-cost manufacturing of the SAW packages 1. The thus manufactured SAW package 1 is mounted on a printed wire board P via bumps 20, for example. Although the silicon substrate 100 is diced into individual SAW elements 50 in the final step in this embodiment, SAW elements 50 may be diced in any appropriate step (i.e., an intermediate step).

As described above, the SAW element 50 is provided on the first surface 10A side of the semiconductor substrate 10, and the SAW element 50 is connected to the trans-substrate conductive plug 12 that penetrates the semiconductor substrate 10 from the first surface 10A and the second surface 10B. Thus, it is possible to electrically connect between the SAW element 50 and the integrated circuit via the trans-substrate conductive plug 12 by providing an integrated circuit for driving the SAW element 50 on the second surface 10B of the semiconductor substrate 10. Accordingly, it is possible to achieve superior operating performance of the SAW element 50 while realizing reduction in the size and thickness of the SAW package 1 as a whole. Furthermore, since the SAW element 50 is sealed by the sealing member 40 between the sealing member 40 and the first surface 10A, it is possible to reliably seal the SAW element 50 while realizing reduction in size and thickness, in addition to achieving superior operating performance of the SAW element 50.

Surface Acoustic Wave Apparatus

Second Embodiment

Figure 13:
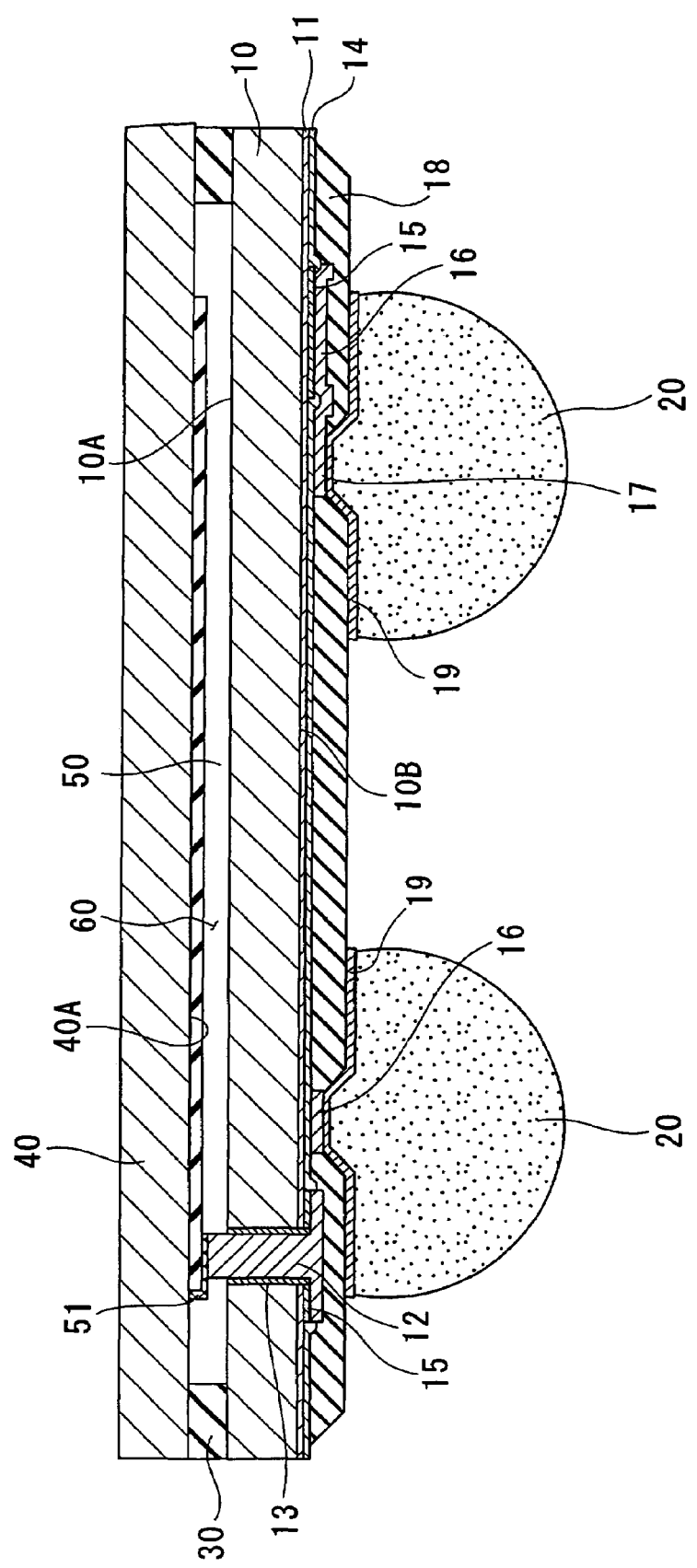
FIG. 13 is a diagram of an electronic component according to a second embodiment of the present invention.

A second embodiment of the SAW package will be explained with reference to FIG. 13. Elements having the same reference number in FIG. 13 refer to elements having identical or similar structure of the above-described embodiment, and the description of such elements will be simplified or omitted.

This embodiment is different from other embodiments in that the SAW element 50 is not formed on the first surface 10A of the semiconductor substrate 10; rather, it is provided on the third surface 40A of the sealing member 40 that faces the first surface 10A and is spaced apart from the first surface 10A. In this embodiment, the SAW element 50 is provided on a member other than the semiconductor substrate 10. Thus, since the SAW element 50 is less affected by thermal stress and a film stress to which the semiconductor substrate 10 is subjected to, excellent performance can be achieved. In this embodiment, the sealing member 40 is a substrate made of a silicon substrate, a quartz substrate, or a substrate containing silicon and diamond. The sealing member 40 having the SAW element 50 on the third surface 40A thereof is bonded to the semiconductor substrate 10 via the adhesive layer 30 so that the first end of the trans-substrate conductive plug 12 formed so as to protrude from the first surface 10A of the semiconductor substrate 10 and a terminal 51 of the SAW element 50 provided on the third surface 40A of the sealing member 40 are electrically connected each other.

Preferably, the surfaces of the first end of the trans-substrate conductive plug 12 and the terminal 51 are subjected to a surface treatment for providing a gold coating, or are provided with a brazing material in order to establish a good metal contact. Alternatively, the first end of the trans-substrate conductive plug 12 and the terminal 51 may be welded together by the action of contraction of the adhesive layer 30. It should be noted that when forming the SAW element 50 on the sealing member 40, plural SAW elements 50 may be provided on a large silicon substrate that is to form the sealing members 40, and the resulting substrate 50 may be diced into individual elements. Again in this embodiment, in addition to dicing individual SAW elements 50 in the final step, SAW elements 50 may be diced in any appropriate step (i.e., an intermediate step).

Once the sealing member 40 is formed using a glass substrate, dicing of the sealing member 40 made of the glass substrate may be done using the dicing machine 110 described above with reference to FIG. 12, by radiation of laser, or by a dry etching or wet etching technique.

Surface Acoustic Wave Apparatus

Third Embodiment

Figure 14:
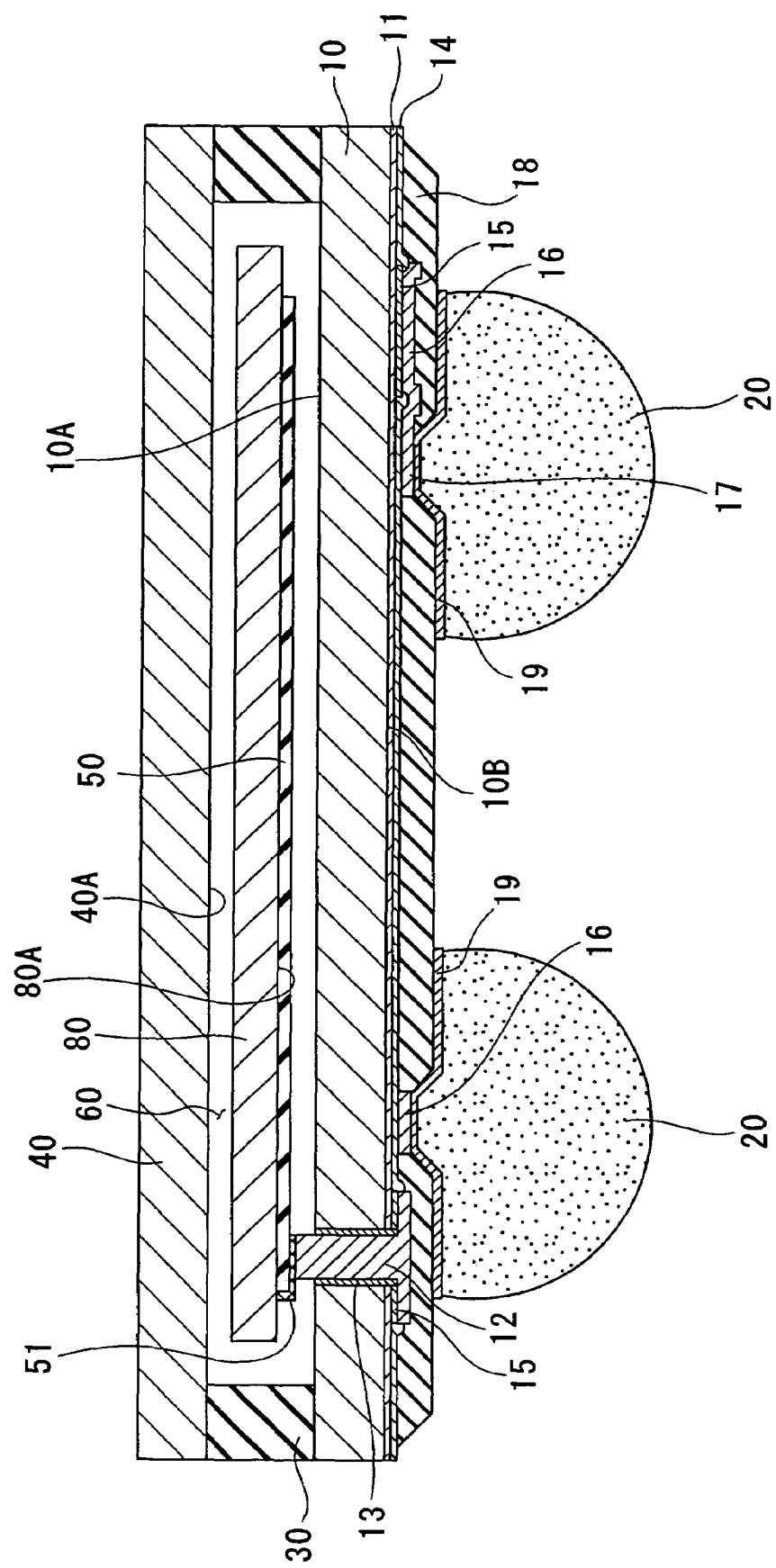
FIG. 14 is a diagram of an electronic component according to a third embodiment of the present invention.

FIG. 14 shows a third embodiment of the SAW package. This embodiment is different from other embodiments in that the SAW element 50 is provided on a second substrate 80 that is provided between the first surface 10A of the semiconductor substrate 10 and the sealing member 40. Again in this embodiment, the SAW element 50 is provided on a member other than the semiconductor substrate 10. Thus, since the SAW element 50 is less affected by thermal stress and a film stress to which the semiconductor substrate 10 is subjected to, excellent performance can be achieved. The SAW element 50 is provided on a surface 80A of the second substrate 80 that faces the first surface 10A of the semiconductor substrate 10. The second substrate 80 is a substrate made of a silicon substrate, a quartz substrate, or a substrate containing silicon and diamond. When forming the SAW element 50 on the second substrate 80, plural SAW elements 50 may be provided on a large silicon substrate that is to form the second substrate 80, and the resulting substrate may be diced into individual elements. Again in this embodiment, in addition to dicing individual SAW elements 50 in the final step, SAW elements 50 may be diced in any appropriate step (i.e., an intermediate step). Then, the first end of the trans-substrate conductive plug 12 formed so as to protrude from the first surface 10A of the semiconductor substrate 10 and a terminal 51 of the SAW element 50 provided on the surface 80A of the second substrate 80 are electrically connected each other. Again in this embodiment, the surfaces of the first end of the trans-substrate conductive plug 12 and the terminal 51 are preferably subjected to a surface treatment for providing a gold coating, or are provided with a brazing material in order to establish a good metal contact. Alternatively, the first end of the trans-substrate conductive plug 12 and the terminal 51 may be welded together by the action of contraction of the adhesive layer 30. Then, the sealing member 40 is bonded to the semiconductor substrate 10 via the adhesive layer 30, so that the second substrate 80 having the SAW element 50 is enclosed in the inner space 60 defined by the semiconductor substrate 10, the sealing member 40, and the adhesive layer 30.

It should be noted that although the first to third embodiments described above have been explained using a surface acoustic wave as an example of the electronic element, an electronic element is not limited to the surface acoustic wave element, and may be any element that are required to be sealed, for example, a crystal resonator, a piezoelectric vibrator, a piezoelectric tuning fork, and the like.

Electronic Apparatus

Figure 15:
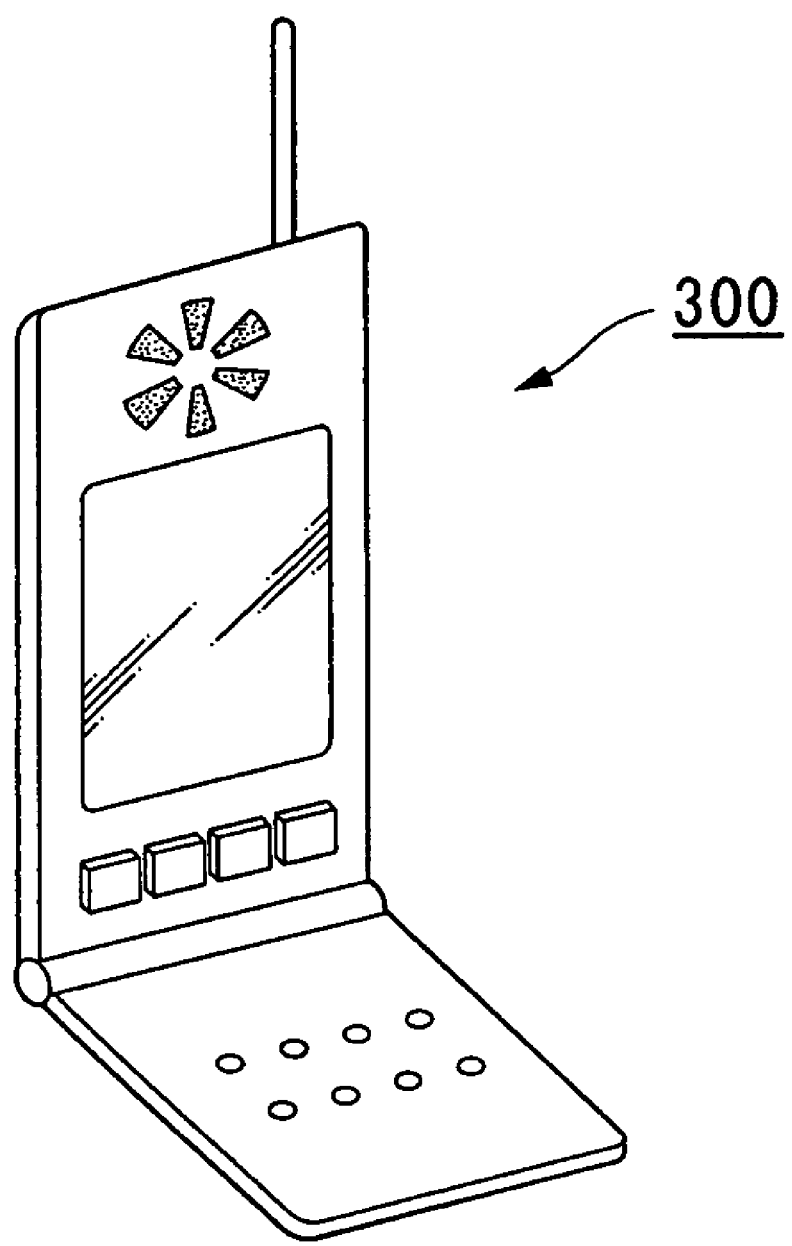
FIG. 15 is a diagram illustrating an electronic apparatus in which the electronic component of the present invention is used.

FIG. 15 is a diagram illustrating a cellular phone 300 that is an example of an electronic apparatus in which the above-described SAW package 1 is used. The size reduction of the cellular phone 300 is achieved since the cellular phone 300 includes the SAW package 1 of the present invention that achieves reduction in size and thickness.

While preferred embodiments of the invention have been described and illustrated above, it should be understood that these are examples of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An electronic component comprising:
   a semiconductor substrate having a flat first surface and a second surface opposite and parallel to the first surface;
   a trans-substrate conductive plug that penetrates the semiconductor substrate from the first surface to the second surface;
   a second member having a third surface that faces and is spaced apart from the first surface;
   a surface acoustic wave element provided on the third surface of the second member and spaced apart from the first surface of the semiconductor substrate, the surface acoustic wave element being electrically connected to one end of the trans-substrate conductive plug and including a piezoelectric thin film and comb-shaped electrodes contacting the piezoelectric thin film;
   a glass sealing member directly connected to the semiconductor substrate by a resin-based adhesive layer, the glass sealing member sealing the surface acoustic wave element in a sealed inner space defined between the sealing member, the adhesive layer and the first surface;
   an integrated circuit which is provided on the second surface of the semiconductor substrate at a position outside of the sealed inner space and is electrically connected to a second end of the trans-substrate conductive plug opposite the one end, and drives and controls the surface acoustic wave element, the integrated circuit including a transistor and a memory element; and
   a connecting terminal for connecting to an external apparatus, the connecting terminal being provided above the second surface of the semiconductor substrate,
   wherein at least a part of the trans-substrate conductive plug is provided on a plane parallel to the first surface within an area corresponding to the surface acoustic wave element, and
   wherein at least a part of the connecting terminal is provided on a plane parallel to the first surface within an area corresponding to the surface acoustic wave element.

2. The electronic component according to claim 1, wherein the second member comprises the sealing member.

3. The electronic component according to claim 1, wherein the second member comprises a second substrate provided between the first surface and the sealing member such that the second member is spaced apart from both the first surface and the sealing member.

4. A circuit board comprising the electronic component according to claim 1 mounted on the circuit board.

5. An electronic apparatus comprising the electronic component according to claim 1.

* * * * *